United States Patent [19]
Sato et al.

[11] Patent Number: 4,633,120
[45] Date of Patent: Dec. 30, 1986

[54] ELECTROSTRICTION TRANSDUCER COMPRISING ELECTROSTRICTION LAYERS OF AXIALLY VARIED THICKNESSES

[75] Inventors: Eiichi Sato; Izumu Fukui; Osamu Inui; Takeshi Yano; Sadayuki Takahashi; Atsushi Ochi, all of Tokyo, Japan

[73] Assignee: NEC Corporation, Tokyo, Japan

[21] Appl. No.: 662,113

[22] Filed: Oct. 18, 1984

[30] Foreign Application Priority Data

Oct. 19, 1983 [JP] Japan .................................. 58-195739

[51] Int. Cl.$^4$ ........................................... H01L 41/08
[52] U.S. Cl. ..................................... 310/328; 310/366; 310/359
[58] Field of Search ............... 310/328, 338, 366, 369, 310/359

[56] References Cited

U.S. PATENT DOCUMENTS

| | | | |
|---|---|---|---|
| 4,229,812 | 10/1980 | Holloway ....................... | 310/328 X |
| 4,342,935 | 8/1982 | Kallmeyer et al. ................. | 310/328 |
| 4,384,230 | 5/1983 | Wisner ........................... | 310/328 X |
| 4,435,666 | 3/1984 | Fukui et al. ......................... | 310/328 |
| 4,438,364 | 3/1984 | Morison .............................. | 310/328 |
| 4,510,412 | 4/1985 | Suda et al. ........................... | 310/328 |

FOREIGN PATENT DOCUMENTS 0035994 3/1977 Japan ................................... 310/328

Primary Examiner—Mark O. Budd
Attorney, Agent, or Firm—Sughrue, Mion, Zinn, Macpeak and Seas

[57] ABSTRACT

In an electrostriction transducer comprising protection layers (21, 22) in which no electric fields are produced during operation, each of end electrostriction layers (41, 42) which are contiguous to the respective protection layers with pertinent ones of internal electrodes (16, 17) interposed, is given a thicker thickness (at) as compared with other or intermediate electrostriction layers (23) to make the transducer have a long life and a high reliability. The intermediate electrostriction layers may have a common thickness (t). Alternatively, the intermediate electrostriction layers may have monotonously decreasing thicknesses when placed nearer to a plane which bisects a pile (19) of the electrostriction layers parallel to both end surfaces of the pile. When a pair of holding members for the transducer are used on both longitudinal ends, each protection layer is preferably received in an indent formed in the holding member. Alternatively, it is preferred that each holding member should comprise a metal plate contiguous to the protection layer and a metal band surrounding parts of the metal plate and the protection layer.

7 Claims, 12 Drawing Figures

ELECTROSTRICTION TRANSDUCER COMPRISING ELECTROSTRICTION LAYERS OF AXIALLY VARIED THICKNESSES

BACKGROUND OF THE INVENTION

This invention relates to an electrostriction transducer which makes use of the longitudinal electrostriction effect known in the art.

Electrostriction transducers are widely used as electrically controllable mechanical driving power sources in a printing head of an impact printer besides in relays, switches, and positioning apparatus. As will later be described more in detail, an electrostriction transducer usually comprises a rectangular pile or heap in which electrostriction layers are stacked on one another axially of the pile with internal electrodes interposed. Although called "internal," the electrodes are spread also on axial ends of the pile. In an electrostriction transducer of the type described, a pair of protection or dummy layers are fixed to both ends of the pile for the purpose which will become clear as the description proceeds. Each protection layer may be made of an electrostriction material of which the electrostriction layers are manufactured. The protection layer is not different in this respect from the electrostriction layers. the protection layer is, however, in contact with only one internal electrode that is spread on each end of the pile.

It is therefore possible at any rate to understand that an electrostriction transducer of the type being considered, comprises a column of an electrostriction material having an axis and a pair of axial ends with internal electrodes disposed in the column to divide the column into a pile of electrostriction layers stacked on one another along the axis and a protection layer positioned between the pile and each of the axial ends. The electrostriction transducer further comprises a pair of external electrodes for supplying a voltage to the internal electrodes to produce electric fields in the electrostriction layers parallel to the axis and to produce an axial elongation of the pile.

As will also be described in the following, the electrostriction transducer is subjected to breakage or like mechanical damages when repeatedly put into operation a number of times. In other words, conventional electrostriction transducers of the type described, have been of a short life and of a low reliability. It has now been confirmed that the liability to the mechanical damages results from concentration of shearing stresses at an interface between the pile and each protection layer.

SUMMARY OF THE INVENTION

It is therefore an object of the present invention to provide an electrostriction transducer of a long life and of a high reliability.

It is another object of this invention to provide an electrostriction transducer comprising a pile of electrostriction layers and internal electrodes and a pair of protection layers on both ends of the pile, in which concentration of shearing stresses is reduced at an interface between the pile and each protection layer.

Additional objects of this invention will become clear as the description proceeds.

In an electrostriction transducer comprising a column of an electrostriction material having an axis, first-type and second-type internal electrodes disposed in said column to divide said column into a plurality of electrostriction layers stacked on one another along said axis, said plurality of electrostriction layers consisting of a first and a second end electrostriction layer and other electrostriction layers which are interposed between said end electrostriction layers, said first end electrostriction layer being separated from said other electrostriction layers by a first-type internal electrode and said second end electrostriction layer being separated from said other electrostriction layers by a second-type internal electrode, said electrostriction transducer further comprising a first and a second protection layer contiguous axially outwardly of said column with respect to the respective first and second end electrostriction layers and having a second-type internal electrode and a first-type internal electrode, respectively, disposed therebetween, and a first and a second external electrode connected, respectively, to the first-type and second-type internal electrodes for supplying a voltage to all of said internal electrodes to produce electric fields in said plurality of electrostriction layers parallel to said axis and to produce an elongation of said column, the improvement wherein each of said end electrostriction layers has a thicker thickness than any of said other electrostriction layers, whereby stresses concentrated at the interface between each of said end electrostriction layers and the adjacent protection layer are reduced.

DESCRIPTION OF THE PREFERRED EMBODIMENTS

Figure 1:
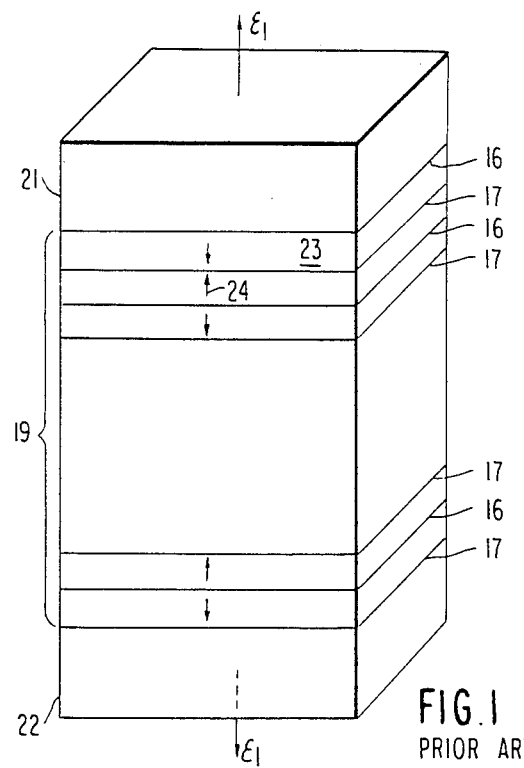
FIG. 1 is an enlarged perspective view of a conventional electrostriction transducer.

Referring to FIG. 1, a conventional electrostriction transducer will be described at first in order to facilitate an understanding of the present invention. The electrostriction transducer comprises a rectangular column of an electrostriction material. A few electrostriction materials will later be exemplified. The column has an axis and a pair of column or axial ends. First and second internal electrodes 16 and 17 are alternatingly disposed in the column to divide the column into a pile or heap 19 of electrostriction layers stacked on one another along the axis and first and second protection or dummy layers 21 and 22 made of the electrostriction material and positioned between the pile 19 and the respective axial ends. Each electrostriction layer is indicated at 23. Each internal electrode 16 or 17 has an area which is substantially equal to a cross-sectional area which the column or the pile 19 has perpendicularly of the axis. The internal electrodes 16 and 17 have ends which are exposed onto side surfaces of the column or of the pile 19.

As will later be described with reference to another figure of the accompanying drawing, first and second external electrodes are extended on an opposing pair of the side surfaces of the pile 19 in electrical contact with the first and the second internal electrodes 16 and 17, respectively. When a voltage is supplied between the external electrodes, electric fields 24 are produced in the respective electrostriction layers 23 parallel to the axis of the column. As exemplified by arrows, the electric fields 24 are antiparallel in each pair of two adjacent electrostriction layers 23. The electric fields 24 make the respective electrostriction layers 23 exhibit the longitudinal electrostrictin effect of the electorstriction material. As a result, the electrostriction layers 23 are subjected to elongtion strains, which are summed up into an axial elongation $\epsilon_1$ of the pile 19 as depicted by arrows at each of the protection layers 21 and 22 despite the fact that the electric fields 24 are antiparallel.

Figure 2:
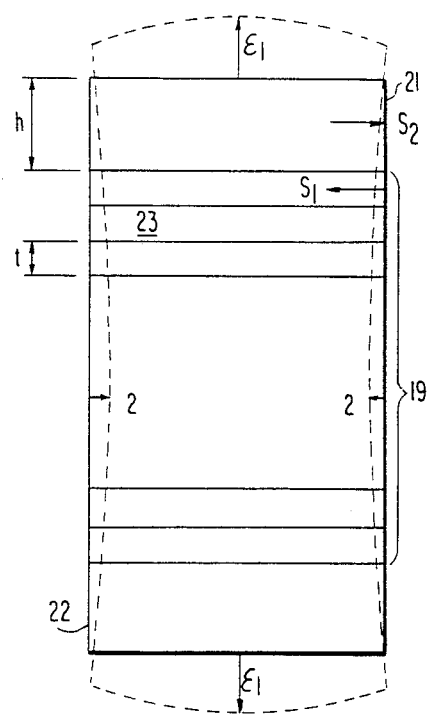
FIG. 2 is a schematic side view of the electrostriction transducer illustrated in FIG. 1.

Turning to FIG. 2, it is to be noted in conjunction with the electrostriction transducer illustrated with reference to FIG. 1 that the electrostriction layers 23 have a common thickness t. Each of the protection layers 21 and 22 is considerably thicker than each electrostriction layer 23 and has a thickness h. Besides the longitudinal electrostriction effect, the electric fields 24 make the respective electrostriction layers 23 exhibit the transverse electrostriction effect of the electrostriction material. As a result, the pile 19 is subjected to a shrinkage $\epsilon_2$ perpendicularly of the axis of the column. The column is therefore deformed as exaggeratedly depicted by dashed lines.

More particularly, no electric fields are produced in the protection layers 21 and 22. As a result, the protection layers 21 and 22 are deformed only a little by the deformation of adjacent ones of the electrostriction layers 23. The elongation $\epsilon_1$ is maximum at the axis of the column and is relatively small at the side surfaces thereof. The shrinkage $\epsilon_2$ is maximum at the longitudinal center of the column. In any event, the shrinkage $\epsilon_2$ results in a force S1 in the electrostriction layer 23 which is contiguous to each of the protection layers 21 and 22 with either of the internal electrodes 16 and 17 interposed. A reaction S2 appears in each of the protection layers 21 and 22. The force S1 and the reaction S2 give rise to concentration of shearing stresses at an interface between each of the protection layers 21 and 22 and the contiguous electrostriction layer 23. It has now been confirmed that the concentration results in breakage of the electrostriction transducer or other mechanical damages thereof.

Figure 3:
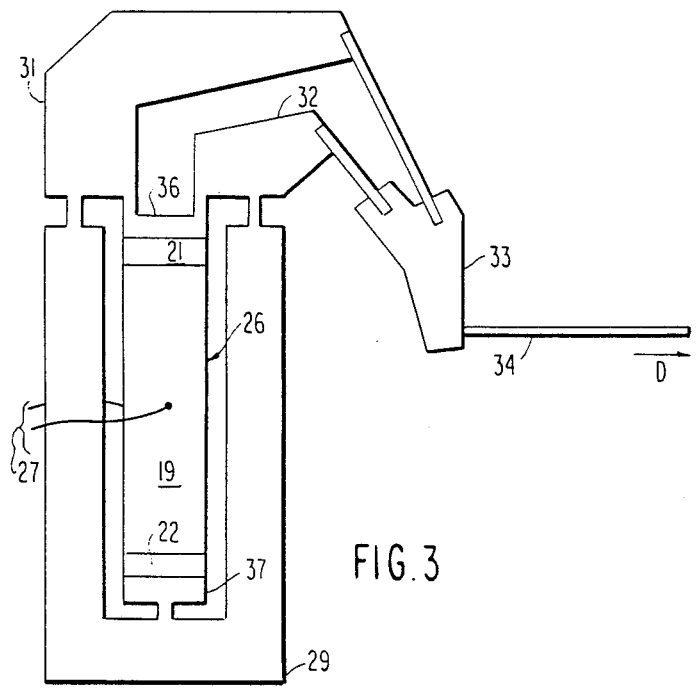
FIG. 3 is a side view of a printing element of a printing head, which comprises an electrostriction transducer.

Further turning to FIG. 3, a printing element is for use in a printing head of an impact printer and comprises an electrostriction transducer 26. In the manner described with reference to FIG. 1, the electrostriction transducer 26 comprises a pile 19 of electrostriction layers and internal electrodes. The first and the second protection layers 21 and 22 are parts of the electrostriction transducer 26. As shown at 27, a pair of lead wires are extended from the first and the second external electrodes, which are on the front and the back sides of the figure. The printing head comprises a plurality of such printing elements.

The printing element further comprises a generally U-shaped base member 29, first and second lever members 31 and 32, a third lever member 33 carried by the first and the second lever members 31 and 32, and a printing rod 34 attached to the third lever member 33. The first protection layer 21 is mechanically coupled to the first and the second lever members 31 and 32 through a first holding member 36. The second protection layer 22 is attached to the base member 29 through a second holding member 37. When the above-mentioned elongation appears in the electrostriction transducer 26, the printing rod 34 is given an impact in a direction and sense D to print a dot on a recording medium (not shown) supplied to the impact printer.

The base member 29, the lever mumbers 31 through 33, and the holding members 36 and 37 are usually made of metal. It is now understood that the protection layers 21 and 22 are useful in mounting the electrostriction transducer 26 on the printing element with electrical insulation insured between the holding members 36 and 37 and those of the internal electrodes 16 and 17 (FIG. 1) which are on both axial ends of the pile 19.

Figure 4:
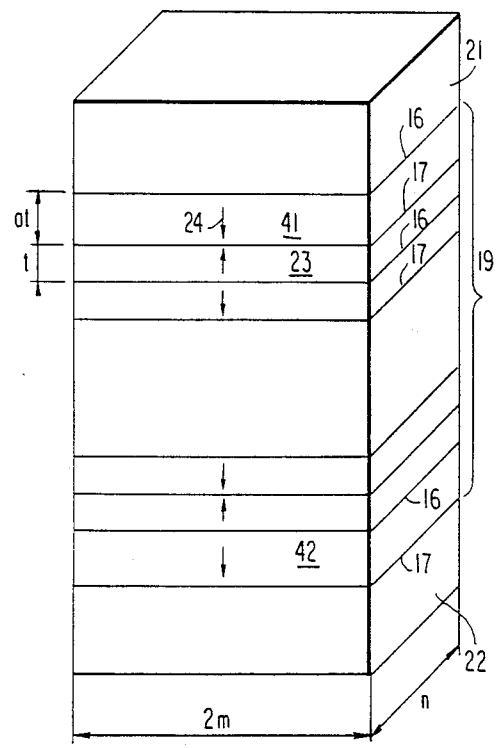
FIG. 4 is a perspective view of an electrostriction transducer according to a first embodiment of the instant invention.

Referring now to FIG. 4, an electrostriction transducer according to a first embodiment of this invention comprises similar parts designated by like reference numerals. In preparation for the description which follows, it will be assumed that the column or the pile 19 has a rectangular cross-section of dimensions 2 m by n. The dimensions 2 m and n will be called a width and a depth, respectively. Those first and second end ones of the electrostriction layers 23 which are contiguous to the first and the second protection layers 21 and 22 with pertinent ones of the first and the second internal electrodes 16 and 17 interposed, will be denoted by 41 and 42. The pile 19 therefore comprises the internal electrodes 16 and 17, the first and the second end electrostriction layers 41 and 42, and other or intermediate electrostriction layers 23. Each of the end electrostriction layers 41 and 42 has a thicker thickness at where a represents a factor which is greater than unity.

The column is manufactured in the manner known in the art except for selection of the thicker thickness at. More specifically, a slurry is prepared at first by dispersing a mixture of presintered powder of an electrostriction material and an organic binder in an organic solvent. The electrostriction material is preferably lead zirconium-titanate or lead magnesium-niobate. By using a film or layer forming device generally used in manufacturing stacked chip capacitors, the slurry is coated on a substrate to provide an overlying layer of a thickness of several hundred microns. After dried, the overlying layer is pealed off the substrate to provide a green sheet. The substrate is preferably a polyester film known by a trademark of Mylar of Du Pont.

By using the screen printing technique, platinum paste is coated on the green sheet to provide a metal film on the green sheet. After cut into desired dimensions, about fifty green sheets with the metal films are stacked, hot pressed, and then sintered into a stack at a temperature of about 1250° C. The stack is machined to provide the column. The number of green sheets in the stack should be selected according to the design of the electrostriction transducer. A mere green sheet should be used to provide one of the first and the second protection layers 21 and 22 without the metal film. The green sheets become the electrostriction layers 23, 41, and 42 and the protection layers 21 and 22. The metal films serve as the internal electrodes 16 and 17.

Figure 5:
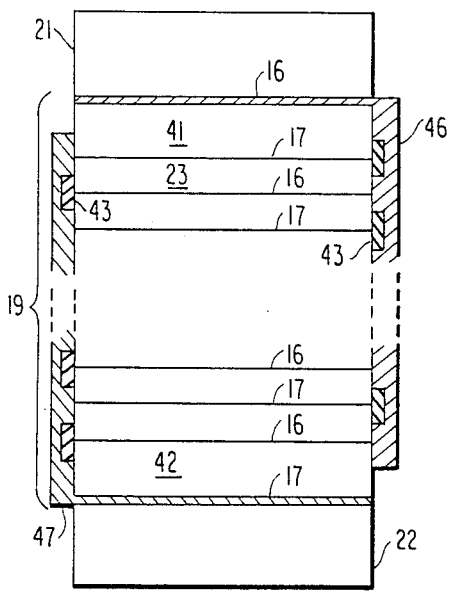
FIG. 5 shows a side view of an electrostriction transducer of the type depicted in FIG. 4 partly in section.

Turning to FIG. 5, a mass 43 of an insulating material is coated on each of those ends of the internal electrodes 16 and 17 which are exposed alternatingly on each of the opposing side surfaces of the pile 19. First and second conductive layers 46 and 47 are formed on the opposing side surfaces to cover the masses 43 of the insulating matirial. The conductive layers 46 and 47 serve as the first and the second external electrodes.

It may be mentioned here that a mere green sheet may be used as either of the first and the second end electrostriction layers 41 and 42 without the metal film. When sintered, the stack of the above-mentioned type provides that part of the pile 19 which has exposed axial ends at the end electrostriction layers 41 and 42. No internal electrodes are present on the exposed axial ends. In other words, the part of the pile 19 neither comprises the first and the second protection layers 21 and 22 nor those two of the internal electrodes 16 and 17 which will be interposed between the protection layers 21 and 22 and the contiguous end electrostriction layers 41 and 42, respectively. The first and the second conductive layers 46 and 47 are extended onto the exposed axial end surfaces to provide the two of the internal electrodes 16 and 17. Two mere green sheets of a thicker thickness are stacked on both axial ends of the pile part, hot pressed, and then sintered to ultimately provide the pile 19 with the external electrodes 46 and 47.

Figure 6:
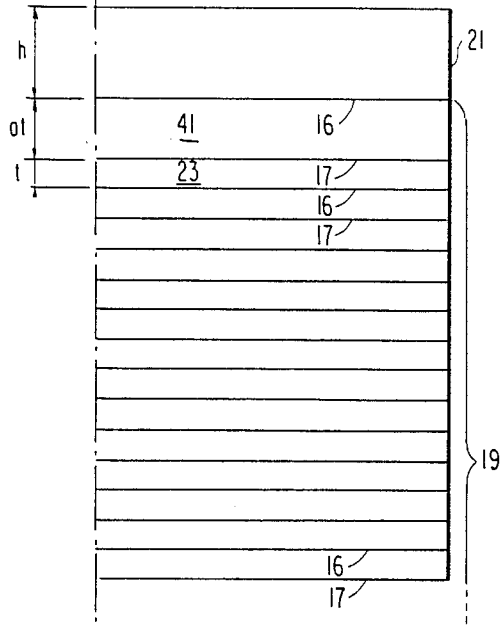
FIG. 6 is a much enlarged schematic side view of the electrostriction transducer depicted in FIG. 4.

Referring to FIG. 6, that quarter part of the electrostriction transducer is depicted which is shown in FIG. 4 on the upper righthand side. The deicted part includes a righthand half of the first protection layer 21 and a righthand half of the first end electrostriction layer 41. It is assumed in connection with the depicted part that an even number of intermediate electrostriction layers 23 are stacked in the pile 19.

As described before, the end electrostriction layer 41 has the thicker thickness at. The electric field 24 produced in the end electrostriction layer 41 therefore has a magnitude which is 1/a times the magnitude of the electric field 24 produced in each intermediate electrostriction layer 23. A reduced shrinkage therefore appears in the end electrostriction layer 41. This reduces the concentration of shearing stresses at the interface between the end elecrostriction layer 41 and the protection layer 21 and the liability of mechanical damages at the interface.

Figure 7:
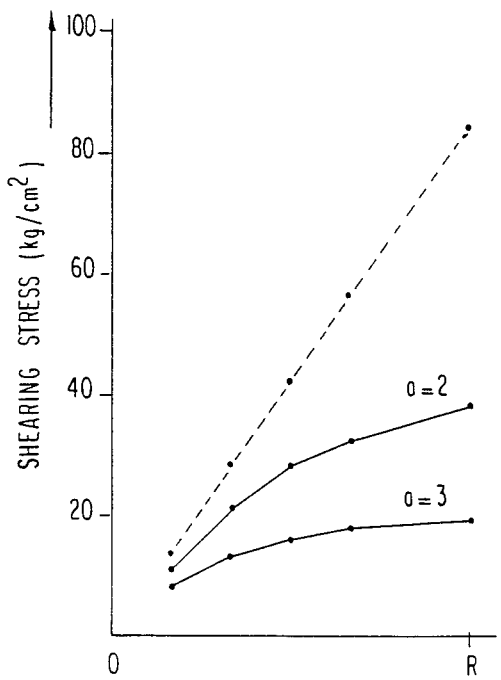
FIG. 7 is a diagram illustrative of shearing stresses which appear in the electrostriction transducer of the type shown in FIG. 1 and in the electrostriction transducers of the type illustrated in FIG. 4.

Turning to FIG. 7, several electrostriction transducers were manufactured for actual tests. Some of the electrostriction transducers were the conventional transducers described with reference to FIG. 1. Others of the electrostriction transducers were of the structure illustrated with reference to FIG. 4.

Each electrostriction transducer had a width 2 m of 3 mm and a depth n of 2 mm and accordingly a cross-sectional area of 6 mm². The thickness h of each protection layer 41 or 42 was 0.5 mm. The thickness t of the electrostriction layers 23 of the conventional transducers and of the intermediate electrostriction layers 23 of the other transducers was 230 microns. Two thicknesses of 460 microns and 690 microns were used as the thicker thickness at. In other words, two and three were selected as the factor a. A d.c. voltage of 200 volts was applied between the lead wires 27 (FIG. 3).

The shearing stresses were calculated at several points on the interface between the protection layer 21 and the end electrostriction layer 41. The points are illustrated along the abscissa between an intersection O of the interface with the axis and another intersection R of the interface with the righthand side surface. An average of the shearing stresses is depicted at the top for the conventional transducers by a dashed line. Averages are illustrated by solid lines in the middle for the transducers of the factor a of two and at the bottom for the transducers wherein the factor a was three. The maximum shearing stresses were about 84, 38, and 19 kg/cm². It is clear that the shearing stresses were unexpectedly reduced to about ½ and ¼ of those for the conventional transducers when the factor a was two and three, respectively.

Incidentally, it is possible as described before to manufacture each electrostriction transducer of the type illustrated with reference to FIG. 4 merely by using two thicker green sheets with and without the metal film to provide the protection layers 21 and 22. Manufacture of the electrostriction transducers of this type is therefore not much complicated as compared with manufacture of the conventional electrostriction transducers.

Figure 8:
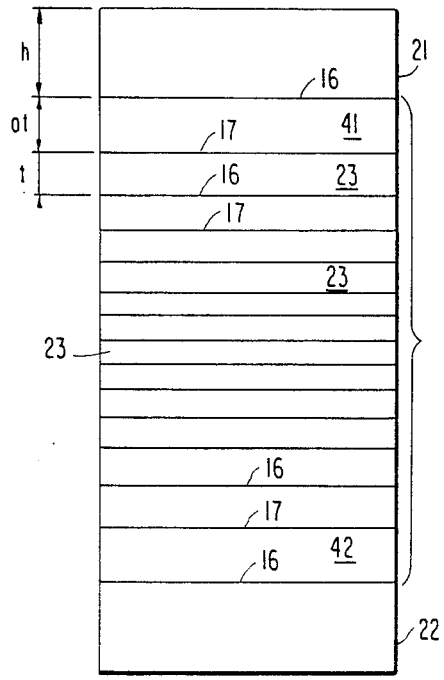
FIG. 8 is a side view of an electrostriction transducer according to a second embodiment of this invention.

Referring now to FIG. 8, an electrostriction transducer according to a second embodiment of this invention comprises similar parts which are designated again by like reference numerals. Besides the first and the second end electrostriction layers 41 and 42, the intermediate electrostriction layers 23 have different thicknesses. More particularly, the thickness is minimum for at least one of the intermediate electrostriction layers 23 that is placed at an axially central position of the pile 19. Others of the intermediate electrostriction layers 23 have monotonously or generally reduced thicknesses when placed farther from each of the protection layers 21 and 22, namely, when positioned nearer to a plane which bisects the pile 19 parallel to the axial ends. The monotonously or generally reduced thicknesses should be thinner than the thicker thickness at. It will readily be understood that the electrostriction transducers of the type being illustrated, are manufactured by preparing green sheets of varied thicknesses.

Figure 9:
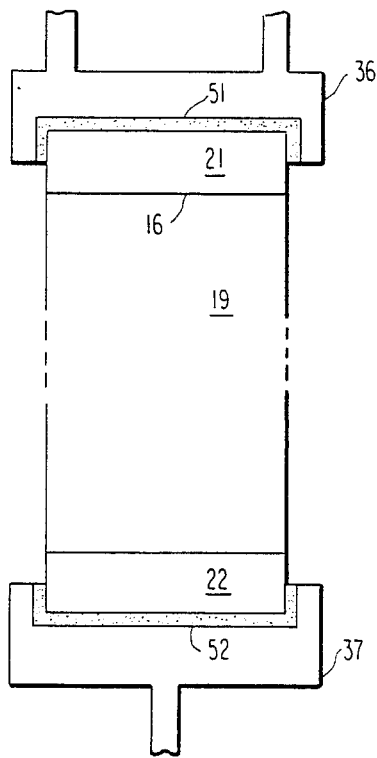
FIG. 9 is a schematic side view of an electrostriction transducer according to a third embodiment of this invention.

Referring to FIG. 9, and electrostriction transducer according to a third embodiment of this invention comprises, in addition to the similar parts designated by like reference numerals, the first and the second holding members 36 and 37 described in conjunction with FIG. 3. The holding members 36 and 37 are fixed to the first and the second protection layers 21 and 22 by first and second films 51 and 52 of an adhesive material.

When the holding members 36 and 37 are plate-shaped as depicted in FIG. 3, the electrostriction transducer is liable to mechanical damages at either or both of the adhesive films 51 and 52. It has now been confirmed that the mechanical damages are caused by a bending stress that results in each protection layer 41 or 42 (FIGS. 4, 8, and others) from the above-described elongation and shrinkage.

Figure 10:
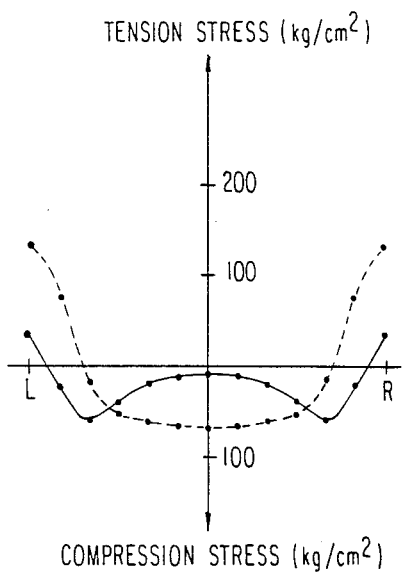
FIG. 10 shows tension and compression stresses in a conventional electrostriction transducer of the type depicted in FIG. 3 and in the electrostriction transducer illustrated in FIG. 9.

Turning to FIG. 10 for a short while, the bending stress applies tension and compression stresses to the adjacent one of the first and the second adhesive films 51 and 52 (FIG. 9). As shown by a dashed line, the bending stress results in a maximum compression stress at an intersection O of the axis with the adhesive film 51 or 52 and an extremely strong tension stress at intersections L and R of the lefthand and the righthand side surfaces with the adhesive film 51 or 52.

Turning back to FIG. 9, each of the first and the second holding members 36 and 37 has an indent which snugly receives at least a portion of the pertinent one of the protection layers 21 and 22. A protruded portion natually surrounds each indent of the holding member 36 or 37. The adhesive film 51 or 52 is used also between the protruded portion and that part of the protection layer 21 or 22 which is received in the indent. The protruded portion serves to suppress the reaction S2 described in connection with FIG. 1 and the bending stress applied to the adhesive film 51 or 52 (the holding member 36 or 37).

Referring again to FIG. 10, the tension and the compression stresses are depicted by a solid line for the electrostriction transducer illustrated with reference to FIG. 9. In marked contrast to the maximum tension stress of about 130 kg/cm$^2$ for the cenventional electrostriction transducer, the maximum tension stress is reduced to about 30 kg/cm$^2$ for the electrostriction transducer of the structure illustrated with reference to FIG. 9. This reduces the liability to breakage of the electrostriction transducer at the adhesive film 51 or 52.

Figure 11:
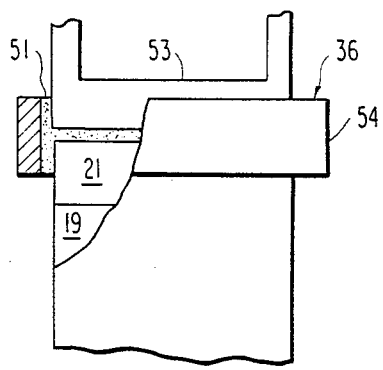
FIG. 11 is a partially cut away fragmentary side view of an electrostriction transducer according to a fourth embodiment of this invention.

Referring to FIG. 11, an electrostriction transducer according to a fourth embodiment of this invention is similar in structure to the transducer illustrated with reference to FIG. 9 and comprises similar parts designated once more by like reference numerals. Each of the first and the second holding members 36 and 37 comprises a metal plate 53 of an area which is equal to the cross-sectional area of the column or of the pile 19. A metal belt 54 of a shape of a hollow rectangular column has an axial length for covering at least a part of the metal plate 53 and a part of the protection layer 21 or 22 and an inside cross-sectional area which is a little wider than the cross-sectional area of the column so as to provide a room for the adhesive film 51 or 52. It will readily be understood that the metal plate 53 and the metal belt 54 serve to suppress the bending stress as is the case with the holding member 36 or 37 with the indent.

Figure 12:
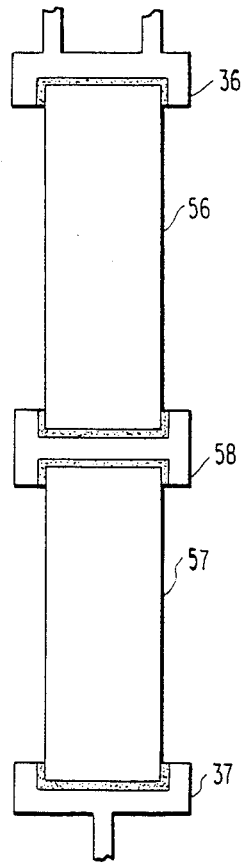
FIG. 12 is a schematic side view of an electrostriction transducer according to a fifth embodiment of this invention.

Finally referreng to FIG. 12, an electrostriction transducer according to a fifth embodiment of this invention comprises first and second electrostriction elements 56 and 57. Each electrostriction element 56 or 57 comprises parts which are similar to those described in conjunction with FIG. 9. An intermediate member 58 is used in place of the holding members 36 and 37 which should be used in the first and the second electrostriction elements according to the illustration in FIG. 9. The intermediate member 58 is made of metal and has indents for receiving the protection layers of the electrostriction elements 56 and 57 at least partly. If the electrostriction elements 56 and 57 were attached to each other directly at an interface or through a metal plate of the type described in conjunction with FIG. 3, a strong tension stress would be applied to the interface or the metal plate from both axial sides. The protruded portions surrounding the respective indents of the intermediate member 58 are effective in reducing the tension stress.

Incidentally, two electrostriction elements 56 and 57 are used for the purpose which will be described in the following. It is not easy in general with the electrostriction transducers of the type illustrated with reference to any one of FIGS. 4, 8, 9, and 11 to acheive a predetermined elongation. This is because the thickness of the green sheet may differ appreciably from a desired value. The constituent of the electrostriction material may not be uniform. Furthermore, the sintering temperature may not be strictly controlled from a lot of the piles 19 to another. On the other hand, the electrostriction transducers must provide an equal elongation in a printing head illustrated with reference to FIG. 3. It is therefore preferred to select two individual electrostriction transducers in a composite electrostriction transducer as the electrostriction elements 56 and 57 so that a sum of the elongations of the individual electrostriction transducers may be uniform. This reduces rejection of the individual electrostriction transducers and raises the yield.

More particularly, the individual electrostriction transducers manufactured as described in connection with FIG. 4, are tested by an electronic micrometer for the elongations. The electrostriction transducers are classified into several groups according to the elongations. It is now possible to select the electrostriction elements 56 and 57 from two of the groups.

While this invention has thus far been described in conjunction with several embodiments thereof, it will now be readily possible or one skilled in the art to carry this invention into effect in various other manners. For example, the protection layers 21 and 22 may be of a material which is different from the electrostriction material of the electrostriction layers 23, 41, and 42. In this event, the electrostriction material of the column should be understood to have a distribution of the constituents. The protection layers 21 and 22 may have different thicknesses. Each internal electrode 16 or 17 may have an area which is narrower than the cross-sectional area of the column or of the pile 19. The metal film may be formed on each green sheet by silver or like paste. At any rate, it should be noted in connection with an electrostriction transducer according to this invention that at least one electrostriction layer 41 or 42 has a thickness which is different from the thicknesses of other electrostriction layers 23. The end electrostriction layers 41 and 42 should preferably have a thicker thickness at which is at least 1.1 times of a common thickness t shared by the other electrostriction layers 23 or a thickest one of the other electrostriction layers 23 as exemplified in FIG. 8.

What is claimed is:

1. In an electrostriction transducer comprising:
    a column of an electrostriction material having an axis,
    first-type and second-type internal electrodes disposed in said column to divide said column into a plurality of electrostriction layers stacked on one another along said axis,
    a first and a second protection layer contiguous axially outwardly of said column, and
    a first and a second external electrode connected respectively to the first-type and second-type internal electrodes for supplying a voltage to all of said internal electrodes to produce electric fields in said plurality of electrostriction layers parallel to said axis and to produce an elongation of said column, the improvement comprising:

first and second end electrostriction layer means, each said means being disposed between said column of electrostriction material and a respective one of said protection layers with a second-type internal electrode and a first-type internal electrode, respectively, disposed therebetween, for reducing stresses concentrated at the interface between said column of electrostriction material and said respective protection layers, each of said first and second electrostriction means comprising a layer of electrostriction material having a thicker thickness than any of said electrostriction layers in said column of electrostriction material.

2. An electrostriction transducer as claimed in claim 1, wherein said thicker thickness of each of said first and second end electrostriction layer means is at least 1.1 times a common thickness shared by said plurality of electrostriction layers in said column.

3. An electrostriction transducer as claimed in claim 2, each of said protection layers being attached to holding means for holding said each of the protection layers, wherein said holding means has an indent in which at least a portion of said each of the protection layers is received with a film of an adhesive material interposed for attachement of said each of the protection layers to said holding means.

4. An electrostriction transducer as claimed in claim 2, each of said protection layers being attached to holding means for holding said each of the protection layers, wherein said holding means comprises a metal plate and a metal band, said metal plate having an area which is equal to an area of said each of the protection layers, said metal band surrounding at least a portion of said each of the protection layers and at least a portion of said metal plate, said each of the protection layers, said metal plate, and said metal band being attached to one another by a film of an adhesive material.

5. An electrostriction transducer as claimed in claim 1, wherein said electrostriction layers have thicknesses which monotonously decrease when said other electrostriction layers are positioned nearer to a plane which bisects said column perpendicular to said axis.

6. An electrostriction transducer as claimed in claim 5, each of said protection layers being attached to holding means for holding said each of the protection layers, wherein said holding means has an indent in which at least a portion of said each of the protection layers is received with a film of an adhesive material interposed for attachment of said each of the protection layers to said holding means.

7. An electrostriction transducer as claimed in claim 5, each of said protection layers being attached to holding means for holding said each of the protection layers, wherein said holding means comprises a metal plate and a metal band, said metal plate having an area which is equal to an area of said each of the protection layers, said metal band surrounding at least a portion of said each of the protection layers and at least a poriton of said metal plate, said each of the protection layers, said metal plate, and said metal band being attached to one another by a film of an adhesive material.

* * * * *